US008076696B2

(12) United States Patent
Beaupre et al.

(10) Patent No.: US 8,076,696 B2
(45) Date of Patent: Dec. 13, 2011

(54) POWER MODULE ASSEMBLY WITH REDUCED INDUCTANCE

(75) Inventors: Richard Alfred Beaupre, Pittsfield, MA (US); Eladio Clemente Delgado, Burnt Hills, NY (US); Ljubisa Dragoljub Stevanovic, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/609,400

(22) Filed: Oct. 30, 2009

(65) Prior Publication Data
US 2011/0101515 A1    May 5, 2011

(51) Int. Cl.
*H01L 31/111* (2006.01)
(52) U.S. Cl. ................... 257/177; 257/E23.169
(58) Field of Classification Search .......... 257/177, 257/178, 691, 693, E23.169
See application file for complete search history.

(56) References Cited

U.S. PATENT DOCUMENTS

| 5,629,839 | A | 5/1997 | Woychik | |
|---|---|---|---|---|
| 6,028,498 | A | 2/2000 | Bickford | |
| 7,002,249 | B2 | 2/2006 | Duffy et al. | |
| 7,187,558 | B2 | 3/2007 | Parkhill et al. | |
| 7,187,568 | B2 | 3/2007 | Radosevich et al. | |
| 7,227,259 | B2 | 6/2007 | Heilbronner et al. | |
| 7,256,489 | B2 | 8/2007 | Ishikawa et al. | |
| 7,449,726 | B2* | 11/2008 | Nakanishi et al. | 257/177 |
| 7,462,886 | B2* | 12/2008 | Sugawara | 257/177 |
| 7,462,888 | B2* | 12/2008 | Sugawara | 257/177 |
| 7,542,317 | B2* | 6/2009 | Azuma et al. | 363/131 |
| 7,679,173 | B2* | 3/2010 | Uno et al. | 257/678 |
| 2002/0153532 | A1* | 10/2002 | Sonobe et al. | 257/150 |
| 2003/0173579 | A1* | 9/2003 | Ishii et al. | 257/177 |
| 2004/0041253 | A1 | 3/2004 | Yamada et al. | |
| 2006/0103005 | A1* | 5/2006 | Schulz-Harder et al. | 257/703 |
| 2006/0108601 | A1* | 5/2006 | Okamoto | 257/177 |
| 2006/0290689 | A1 | 12/2006 | Grant et al. | |
| 2007/0051974 | A1* | 3/2007 | Azuma et al. | 257/177 |
| 2008/0017882 | A1* | 1/2008 | Nakanishi et al. | 257/177 |
| 2008/0105896 | A1* | 5/2008 | Kawaguchi et al. | 257/177 |
| 2009/0095979 | A1* | 4/2009 | Saito et al. | 257/177 |

(Continued)

FOREIGN PATENT DOCUMENTS

DE        10237561 C1    10/2003

(Continued)

OTHER PUBLICATIONS

European Search Report dated Feb. 17, 2011.

(Continued)

*Primary Examiner* — Nathan Ha
(74) *Attorney, Agent, or Firm* — Richard D. Emery

(57) ABSTRACT

A device is provided that includes a first conductive substrate and a second conductive substrate. A first power semiconductor component having a first thickness can be electrically coupled to the first conductive substrate. A second power semiconductor component having a second thickness can be electrically coupled to the second conductive substrate. A positive terminal can also be electrically coupled to the first conductive substrate, while a negative terminal can be electrically coupled to the second power semiconductor component, and an output terminal may be electrically coupled to the first power semiconductor component and the second conductive substrate. The terminals, the power semiconductor components, and the conductive substrates may thereby be incorporated into a common circuit loop, and may together be configured such that a width of the circuit loop in at least one direction is defined by at least one of the first thickness or the second thickness.

19 Claims, 14 Drawing Sheets

FOREIGN PATENT DOCUMENTS

| | | |
|---|---|---|
| EP | 0609528 A1 | 8/1994 |
| EP | 0588094 B1 | 3/1999 |
| EP | 1098369 A2 | 5/2001 |

OTHER PUBLICATIONS

Zhu et al., "Characterization of Power Electronics System Interconnect Parasitics Using Time Domain Reflectometry", IEEE Transactions on Power Electronics, vol. 14, No. 4, pp. 672-678, Jul. 1999.

Kawaguchi et al., "Multi Chip Module With Minimum Parasitic Inductance for New Generation Voltage Regulator", Proceedings of the 17th International Symposium on Power Semiconductor Devices & IC's, Santa Barbara, CA, pp. 1-3 and p. 162, May 23-26, 2005.

Wintrich et al., "Electrical and Thermal Optimization of an Automotive Power Module Family", Paris France, pp. 1-7, Oct. 24 & 25, 2007.

\* cited by examiner

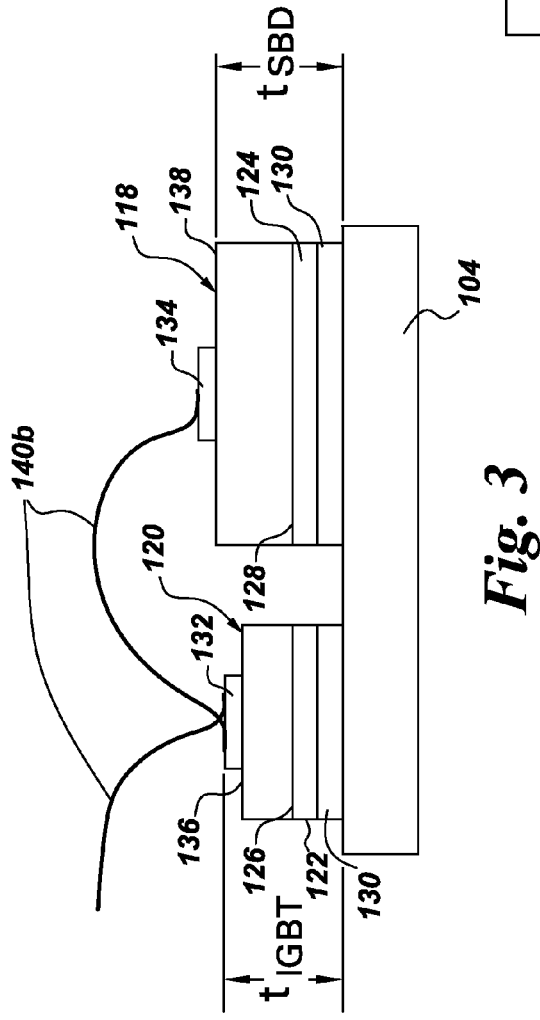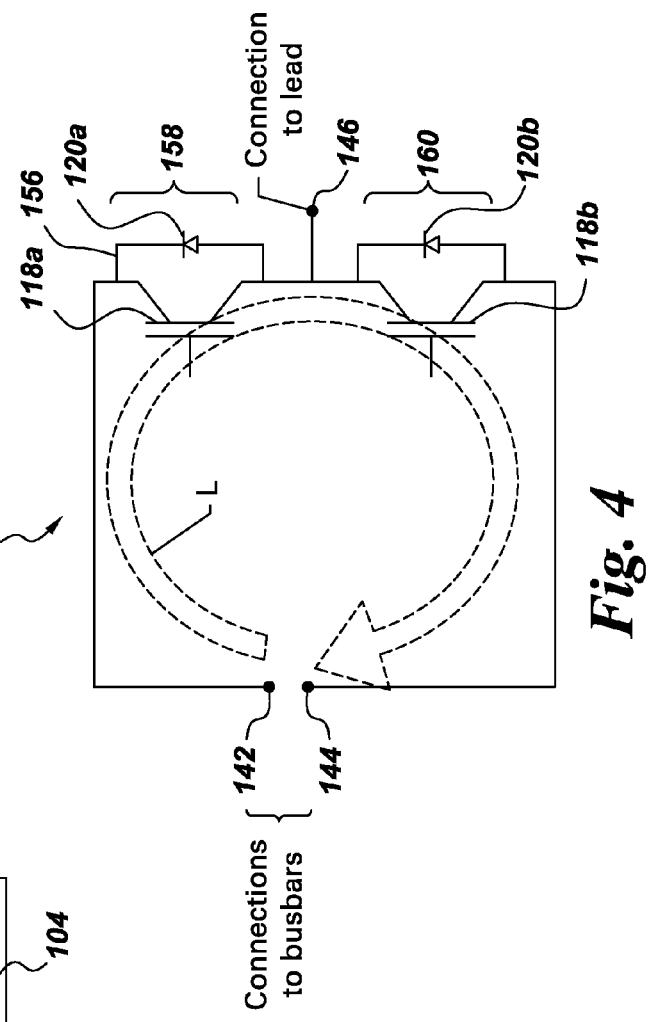
Fig. 3
Fig. 4

POWER MODULE ASSEMBLY WITH REDUCED INDUCTANCE

BACKGROUND

Embodiments of the invention relate generally to power modules, and more particularly to power modules having reduced parasitic inductance.

Power semiconductor modules, or power modules, are used for various power conversion applications. Such applications include, for example, inversion applications for converting direct current (DC) power to alternating current (AC) power, rectification applications for converting AC to DC power, voltage conversion applications for converting DC power from one voltage to another, and frequency conversion applications for converting AC power from one oscillation frequency to another. One common method for effecting any of the above power conversions is to switch a power transistor between a conductive and a non-conductive state with a variable duty cycle whose average is the desired output voltage.

As the switch structures in the module are repeatedly switched, inductance due to the configuration of the circuit ("parasitic inductance") can lead to increased power losses resulting from greater voltage and current oscillation and reduced reliability due to greater overvoltage stresses applied to the power semiconductors (IGBTs, MOSFETs, diodes, etc.). Therefore, it may be desirable in some cases to minimize parasitic inductance of the power module.

BRIEF DESCRIPTION

In one aspect, a device, such as a power module, is provided. The device can include a first conductive substrate and a second conductive substrate. A first power semiconductor component having a first thickness can be electrically coupled to (and possibly disposed on) the first conductive substrate. A second power semiconductor component having a second thickness can be electrically coupled to (and possible disposed on) the second conductive substrate. For example, the first and second power semiconductor components can include opposing front and back surfaces, and the back surface of the first power semiconductor component can be electrically coupled to the first conductive substrate and the back surface of the second power semiconductor component being electrically coupled to the second conductive substrate. The first and second power semiconductor components may be formed of silicon carbide, and may respectively include at least one of an insulated gate bipolar transistor, a metal-oxide-semiconductor field effect transistor, a diode, and/or a thyristor.

A positive terminal can also be electrically coupled to the first conductive substrate, while a negative terminal can be electrically coupled to the second power semiconductor component, and an output terminal may be electrically coupled to the first power semiconductor component and the second conductive substrate. The positive, negative, and output terminals may, for example, be configured to support an instantaneous electrical current of at least about 10 A. The negative terminal may substantially oppose the positive terminal, for example, as where the positive and negative terminals abut opposing sides of a power insulation layer. The positive and negative terminals can be substantially planar. The output terminal and the positive terminal abut opposing sides of an output insulation layer, and the output terminal and the negative terminal may also abut opposing sides of the output insulation layer.

The device may also include a substantially planar baseplate. The first and second conductive substrates can be respectively disposed on the baseplate and the positive and negative terminals may extend substantially perpendicularly away from the baseplate. A respective diode connected in an anti-parallel arrangement across each of the first and second power semiconductor components may also be included.

Positive leads (e.g., wire bonds) may act to electrically couple the positive terminal and the first conductive substrate. Negative leads (e.g., wire bonds) may electrically couple the negative terminal and the second power semiconductor component. First output leads (e.g., wire bonds) may electrically couple the output terminal and the first power semiconductor component. Second output leads (e.g., wire bonds) may electrically couple the output terminal and the second conductive substrate. Each of the positive leads can be proximal to a respective first output lead substantially along a length of the respective positive lead, and each of the second output leads can be proximal to a respective negative lead substantially along a length of the respective second output lead.

The positive and negative terminals, the first and second power semiconductor components, and the first and second conductive substrates may thereby be incorporated into a common circuit loop, and may together be configured such that a width of the circuit loop in at least one direction is defined by at least one of the first thickness or the second thickness. In one embodiment, the first width of the circuit loop in at least one direction may be about equal to the first thickness and the second width of the circuit loop in at least one direction may be about equal to the second thickness, and the circuit loop everywhere may have a width that is less than or about equal to the greater of the first thickness and the second thickness. In another embodiment, the first width of the circuit loop in at least one direction may be defined by the first thickness and the second width of the circuit loop in at least one direction may be defined by the second thickness.

The device may further include a connector configured to electrically couple the positive and negative terminals to respective busbars. For example, the connector may include opposing electrodes configured to make respective electrical contact with the positive and negative terminals. A separation distance between the opposing electrodes can be substantially similar to an aggregate thickness of the positive and negative terminals and a power insulation layer disposed therebetween.

DRAWINGS

These and other features, aspects, and advantages of the present invention will become better understood when the following detailed description is read with reference to the accompanying drawings in which like characters represent like parts throughout the drawings, wherein:

FIG. 3 is a magnified side view of the region labeled 3 in FIG. 2;

FIG. 4 is a schematic view of the power module of FIG. 1, showing the circuit formed by the components thereof;

DETAILED DESCRIPTION

Figure 1:
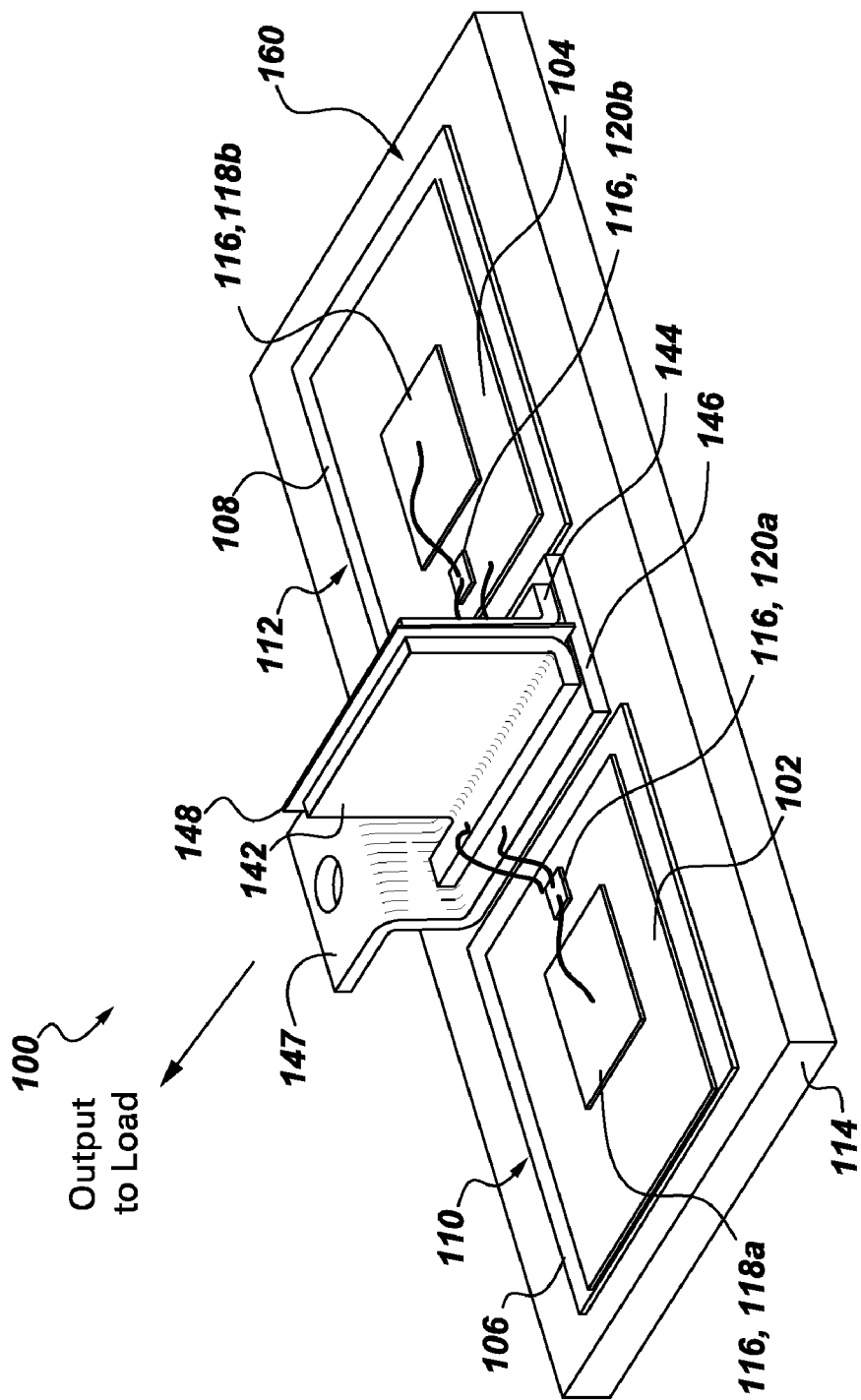
FIG. 1 is a perspective view of a power module configured in accordance with an example embodiment.

Example embodiments of the present invention are described below in detail with reference to the accompanying drawings, where the same reference numerals denote the same parts throughout the drawings. Some of these embodiments may address the above and other needs.

Figure 2:
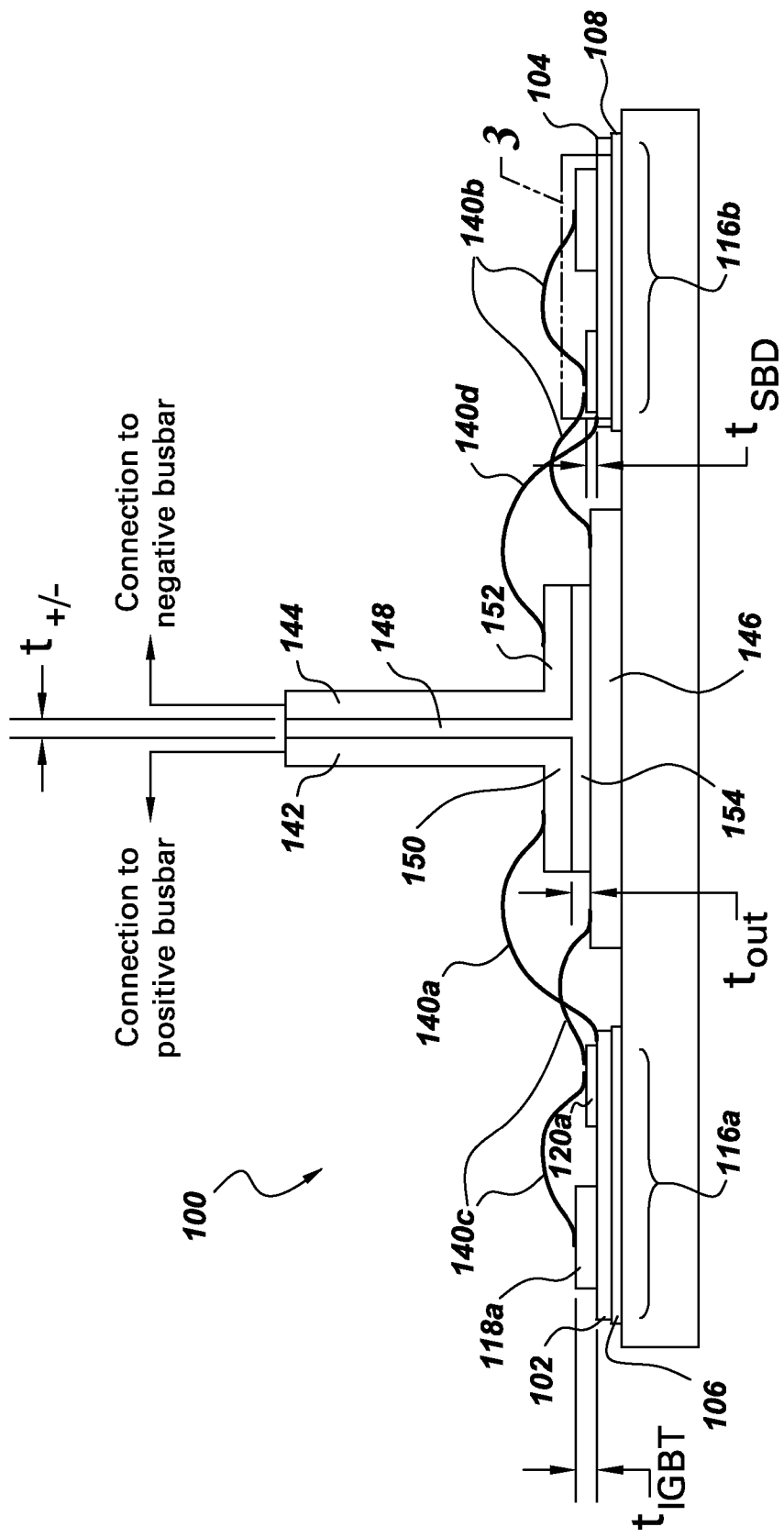
FIG. 2 is a side view of the power module of FIG. 1.
Figure 5:
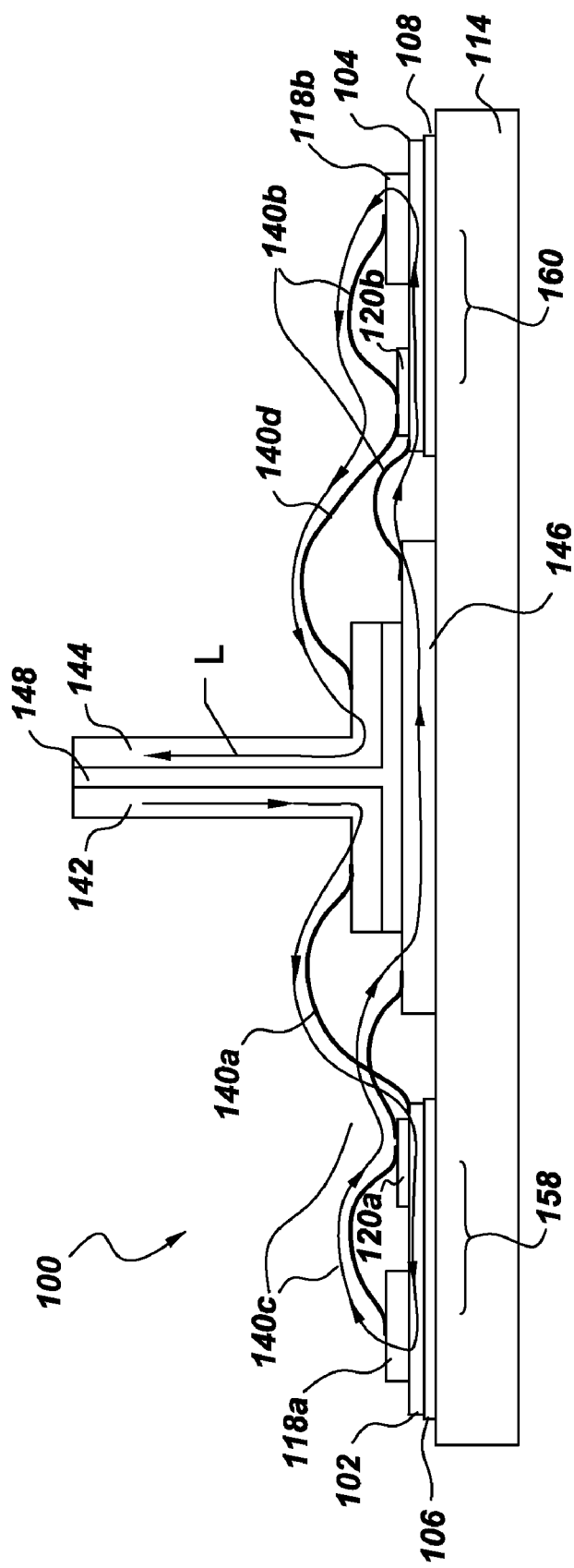
FIG. 5 is a side view of the power module of FIG. 1 illustrating the path along which current flows when the switch structures of the module are in a conducting state.
Figure 6:
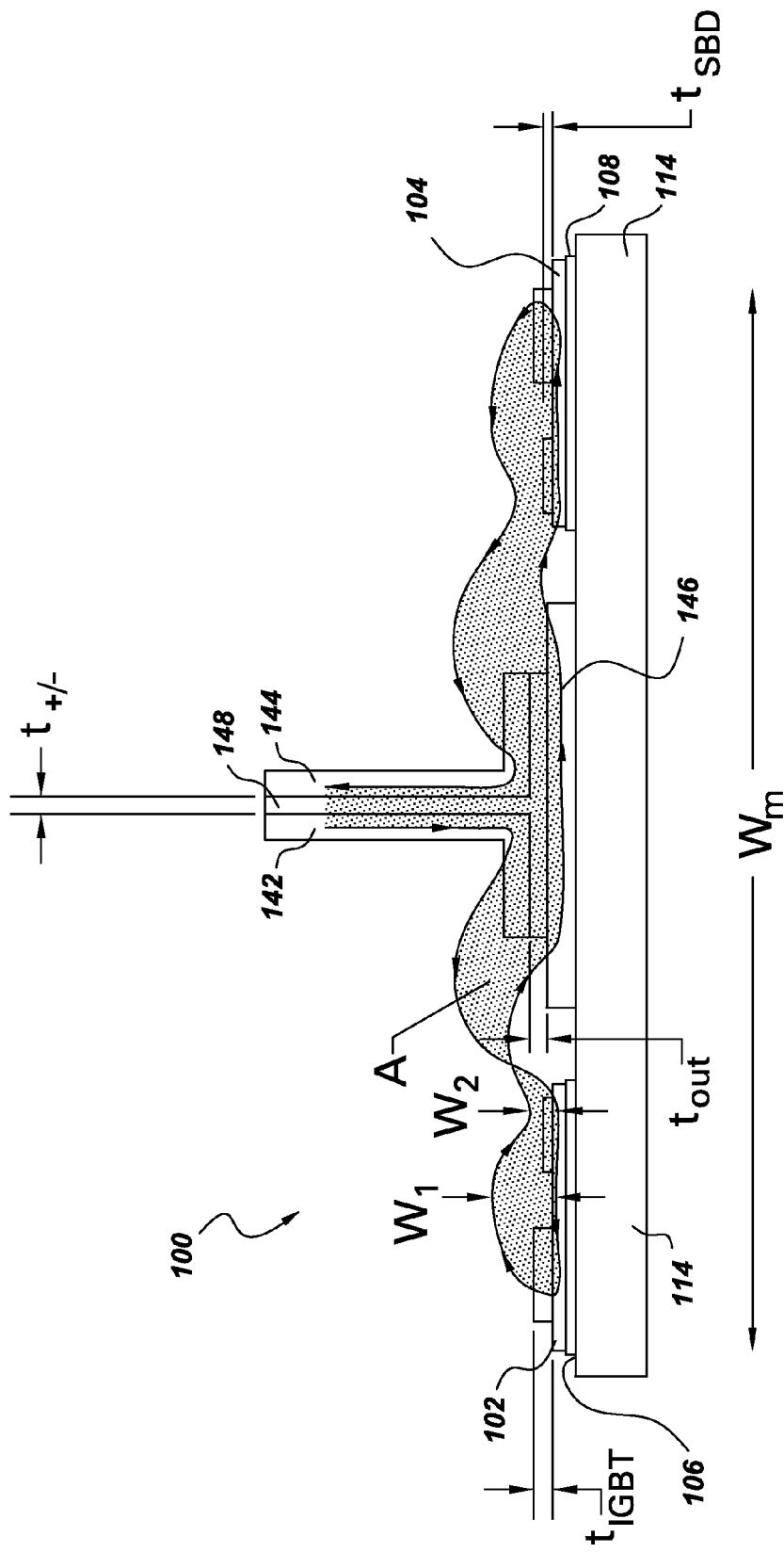
FIG. 6 is a side view of the power module of FIG. 1 illustrating the area defined by the path along which current flows when the switch structures of the module are in a conducting state.

Referring to FIGS. 1 and 2, therein is shown a device, such as a power module 100, configured in accordance with an example embodiment. The power module 100 can include a first and a second conductive substrate 102, 104. For example, each of the first and second conductive substrates 102, 104 may include a respective patterned copper layer, which layers can be disposed on respective ceramic tiles 106, 108 so as to form parts of respective power electronic substrates, such as a direct bonded copper substrate 110, 112. The first and second conductive substrates 102, 104 (and generally any associated portions of direct bonded copper substrates 110, 112 within which the conductive substrates may be integrated) may be disposed on a baseplate 114, which baseplate may be substantially planar.

The module 100 may also include a variety of power semiconductor components 116. For example, the module 100 may include one or more insulated gate bipolar transistors (IGBTs) 118 and one or more Schottky Barrier Diodes (SBDs) 120. The power semiconductor components can be formed of semiconducting material, such as, for example, silicon and/or silicon carbide. A first set 116a of IGBTs 118a and SBDs 120a may be electrically coupled to the first conductive substrate 102, while a second set 116b of IGBTs 118b and SBDs 120b can be electrically coupled to the second conductive substrate 104.

The first set 116a of IGBTs 118a and SBDs 120a may also be disposed on the first conductive substrate 102, and the second set 116b of IGBTs 118b and SBDs 120b can be disposed on the second conductive substrate 104. For example, referring to FIGS. 2 and 3, the IGBTs 118 and the SBDs 120 may respectively include device contacts ("lower contacts") 122, 124 at one surface 126, 128 of the respective component, which lower contacts can be connected to the associated conductive substrate 102, 104 by solder 130. The surfaces 126, 128 are referred to as "back surfaces" based on the fact that these surfaces are obscured from view when coupled to the conductive substrate 102, 104. The IGBTs 118 and the SBDs 120 may also respectively include device contacts ("upper contacts") 132, 134 at an opposing surface 136, 138 of the respective component, which upper contacts can be contacted by wire bonds 140b (the interconnection of devices using, say, wire bonds, is discussed further below).

Each type of power semiconductor component 116 may have a thickness. For example, the IGBTs 118 may be associated with a characteristic component thickness $t_{IGBT}$, while the SBDs 120 may be associated with a characteristic component thickness $t_{SBD}$ that may be different from $t_{IGBT}$. Alternatively, each semiconductor component 116 may be associated with a unique component thickness.

Referring again to FIGS. 1 and 2, the module 100 can also include a positive terminal 142 and a negative terminal 144, which may be configured to couple to positive and negative busbars (not shown), respectively. The manner in which the positive terminal 142 and negative terminal 144 couple to the respective busbars is discussed further below. It is noted that the "positive" and "negative" terminals and/or busbars are expected, in operation, to be at different electric potentials relative to one another, but are not restricted to a specific polarity.

An output terminal 146 may also be included, which output terminal may be configured to couple to an electrical load (not shown) to which power is provided via the module 100. For example, the output terminal 146 may include a flange 147 to which the port of an electrical load may be physically bolted. In some embodiments, the terminals 142, 144, 146 may be configured to support an instantaneous electrical current of at least about 10 A (e.g., as where the module 100 is used to supply power to a relatively lower horse-power motor), and in other embodiments may be configured to support an instantaneous electrical current of at least about 100 A (e.g., as where the module is used to supply power to a relatively higher horse-power motor).

The positive and negative terminals 142, 144 may substantially oppose one another, such that the terminals are in relatively close proximity over substantially the entirety of the terminals. For example, the positive and negative terminals 142, 144 may abut opposing sides of a power insulation layer 148, which power insulation layer can have a thickness $t_{+/-}$. In some embodiments, the positive and negative terminals 142, 144 may extend substantially perpendicularly away from the baseplate 114, and may include respective flanges 150, 152 that provide an area for bonding thereto. The output terminal 146 may be disposed in relatively close proximity to the positive and negative terminals 142, 144. For example, the output terminal 146 and the positive terminal 142 can abut opposing sides of an output insulation layer 154, as can the output terminal and the negative terminal 144, with the output insulation layer having a thickness $t_{out}$.

The positive terminal 142 may be electrically coupled to the first conductive substrate 102, while the negative terminal 144 may be electrically coupled to one or more of the IGBTs 118b and SBDs 120b. The output terminal 146 may be electrically coupled to one or more of the IGBTs 118a and SBDs 120a and also to the second conductive substrate 104. For example, leads ("positive leads"), such as wire bonds 140a, can electrically couple the positive terminal 142 and the first conductive substrate 102, while other leads ("negative leads"), such as wire bonds 140b, can electrically couple the negative terminal 144 and one or more components from the second set of power semiconductor components 116b. Still other leads ("first output leads"), such as wire bonds 140c, can electrically couple the output terminal 146 and one or more components from the first set of power semiconductor components 116a. Yet other leads ("second output leads"), such as wire bonds 140d, can electrically couple the output terminal 146 and the second conductive substrate 104. In this way, each of the IGBTs 118a, 118b can have connected thereacross, in an antiparallel arrangement, a respective SBD 120a, 120b.

Referring to FIGS. 1, 2, and 4-6, once the conductive substrates 102, 104, the power semiconductor components 116, and the terminals 142, 144, 146 are interconnected as described above, they tend to form a circuit 156 that includes an "upper" switch structure 158 and a "lower" switch structure 160 (each switch structure including, e.g., IGBTs 118 and associated SBDs 120). In operation, the terminals 142, 144, and 146 can be connected, respectively, to a positive busbar (say, maintained at about 120 V DC), a negative busbar (say, maintained at about 0 V DC), and an electrical load requiring a different voltage than that provided by the busbars (say, 120 V, 60 Hz AC). The IGBTs 118a, 118b can be switched between a conductive and a non-conductive state ("regulated"). By appropriately choosing the rate of regulation of the IGBTs 118a, 118b, the proper output voltage for supplying the load can be provided at the output terminal 146. The SBDs 120, being connected across and anti-parallel with respective IGBTs 118, can provide a path for the peak inductive load current that may be produced when the IGBTs are switched from a conductive to a non-conductive state.

In a conducting state of the switch structures 158, 160 (i.e., in a conducting state of the IGBTs 118), current in the module 100 flows sequentially (from an external busbar that makes electrical contact with the positive terminal 142) to the positive terminal, then to the first conductive substrate 102 (via the positive leads 140a), then to the IGBT 118a of the upper switch 158, then to the output terminal 146 (via the first output leads 140c), then to the second conductive substrate 104 (via the second output leads 140d), then to the IGBT 118b of the lower switch 160, and then (via the negative leads 140b) to the negative terminal 144 (and ultimately on to another external busbar that makes electrical contact with the negative terminal). As such, when the upper and lower switch structures 158, 160 are in conducting states, the conductive substrates 102, 104, the IGBTs 118, and the terminals 142, 144, 146, along with the wire bonds 140a-d, may at least partially form a loop L along which the current flows.

The loop L includes an area A. Generally, as the magnitude of the area A increases, the parasitic inductance associated with the circuit 156 proportionately increases. As such, it may be desirable to minimize the area A. With the power semiconductor components 116 being bonded directly to underlying conductive substrates 102, 104, and with the positive and negative terminals 142, 144 being disposed in opposition to one another and separated by only a thin power insulation layer 148, and further with the output terminal 146 being disposed directly below the positive and negative terminals and separated from each by a thin output insulation layer 154, the loop L tends to be collapsed to the limits established by the physical dimensions of the constituent components of the circuit 156. That is, the area A has a width $w_m$ along a major direction of the area, but a smaller width $w_1$, along a transverse direction in the vicinity of the IGBTs 118, which width $w_1$, is about equal to the thickness $t_{IGBT}$ of the IGBT, and another relatively smaller width $w_2$ along a transverse direction in the vicinity of the SBDs 120, which width $w_2$ is about equal to the thickness $t_{SBD}$ of the SBD. In this way, the first width $w_1$, is defined by the thickness $t_{IGBT}$, as the width $w_1$, is virtually entirely accounted for by the thickness of the IGBT, and the second width $w_2$ is similarly defined by the thickness $t_{SBD}$.

Where the IGBTs 118 and the SBDs 120 are semiconductor components, the thicknesses $t_{IGST}$ and $t_{SBD}$ tend to be relatively small (on the order of 100-1000 µm). Further, a high performance insulation system can be employed as the power insulation layer 148 and as the output insulation layer 154, which high performance insulation system would provide electrical isolation via a thin insulation layer, thereby keeping the respective thicknesses $t_{+/-}$ and $t_{out}$ of the power insulation layer 148 and the output insulation layer 154 relatively small. Examples of such high performance insulation systems include, for example, polyimide (e.g., the polyimide film marketed by E. I. du Pont de Nemours and Company (Wilmington, Del.) under the trade name KAPTON). In some embodiments, the thicknesses $t_{+/-}$ and $t_{out}$ respectively, are expected to be less than either of the thicknesses $t_{IGBT}$ and $t_{SBD}$ tend, and on the order of 100-1000 µm. Overall, as the thicknesses $t_{IGBT}$, $t_{SBD}$, $t_{+/-}$ and $t_{out}$ are reduced, the area A approaches a one-dimensional structure (or an aggregate of one-dimensional structures), with A correspondingly approaching zero.

Figure 7:
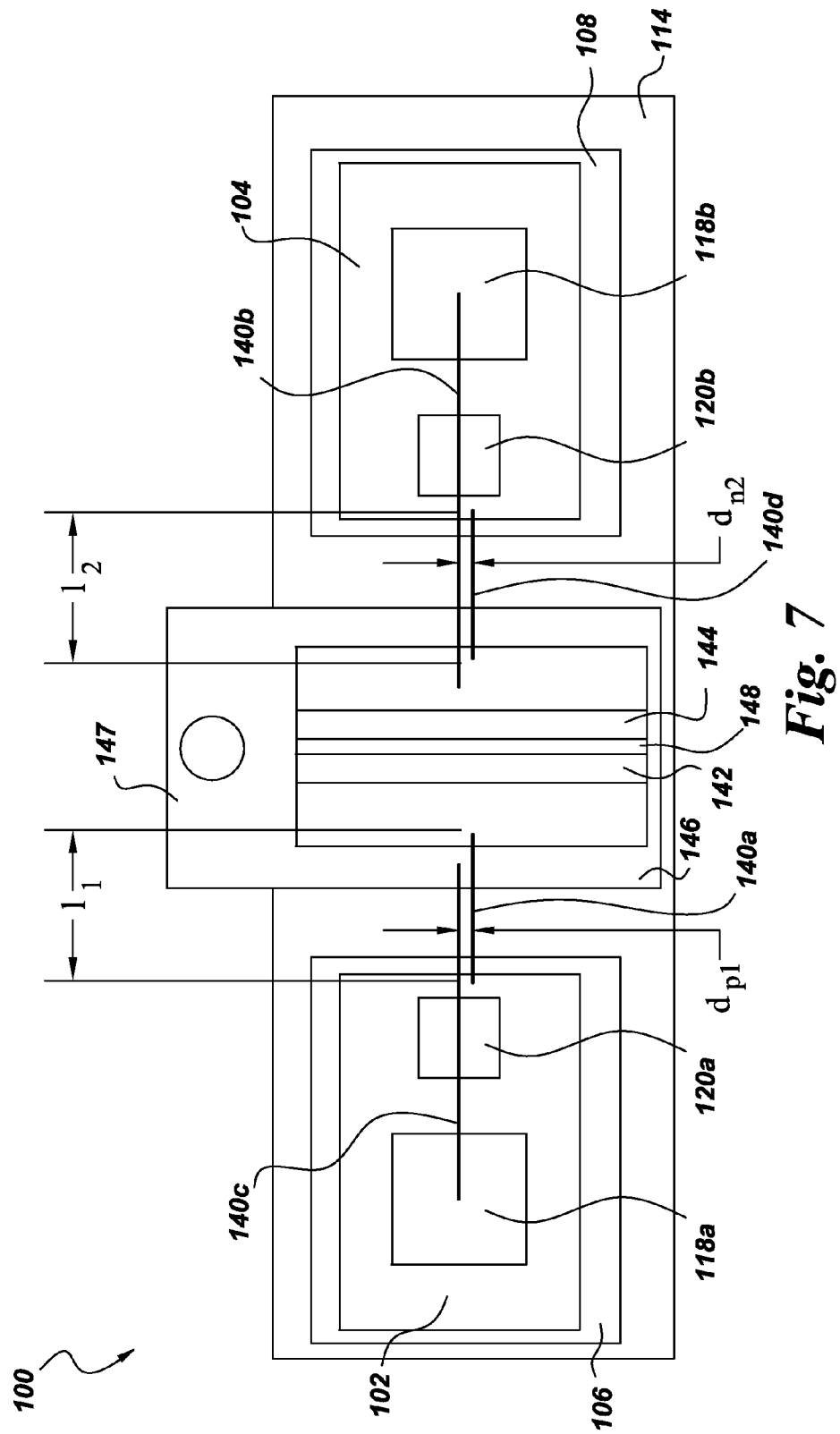
FIG. 7 is a plan view of the power module of FIG. 1.
Figure 8:
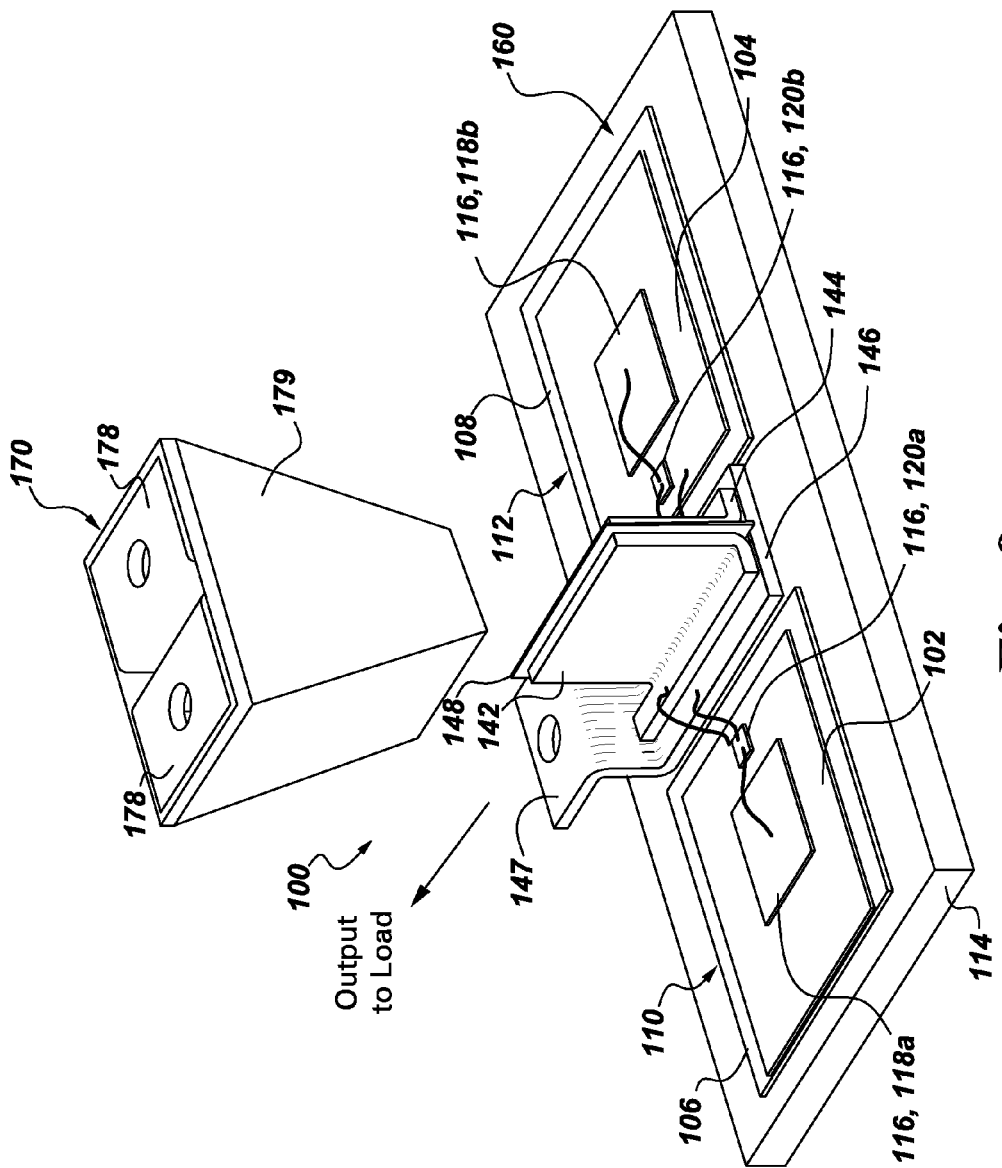
FIG. 8 is a perspective view of the power module of FIG. 1 and an associated connector.
Figure 9:
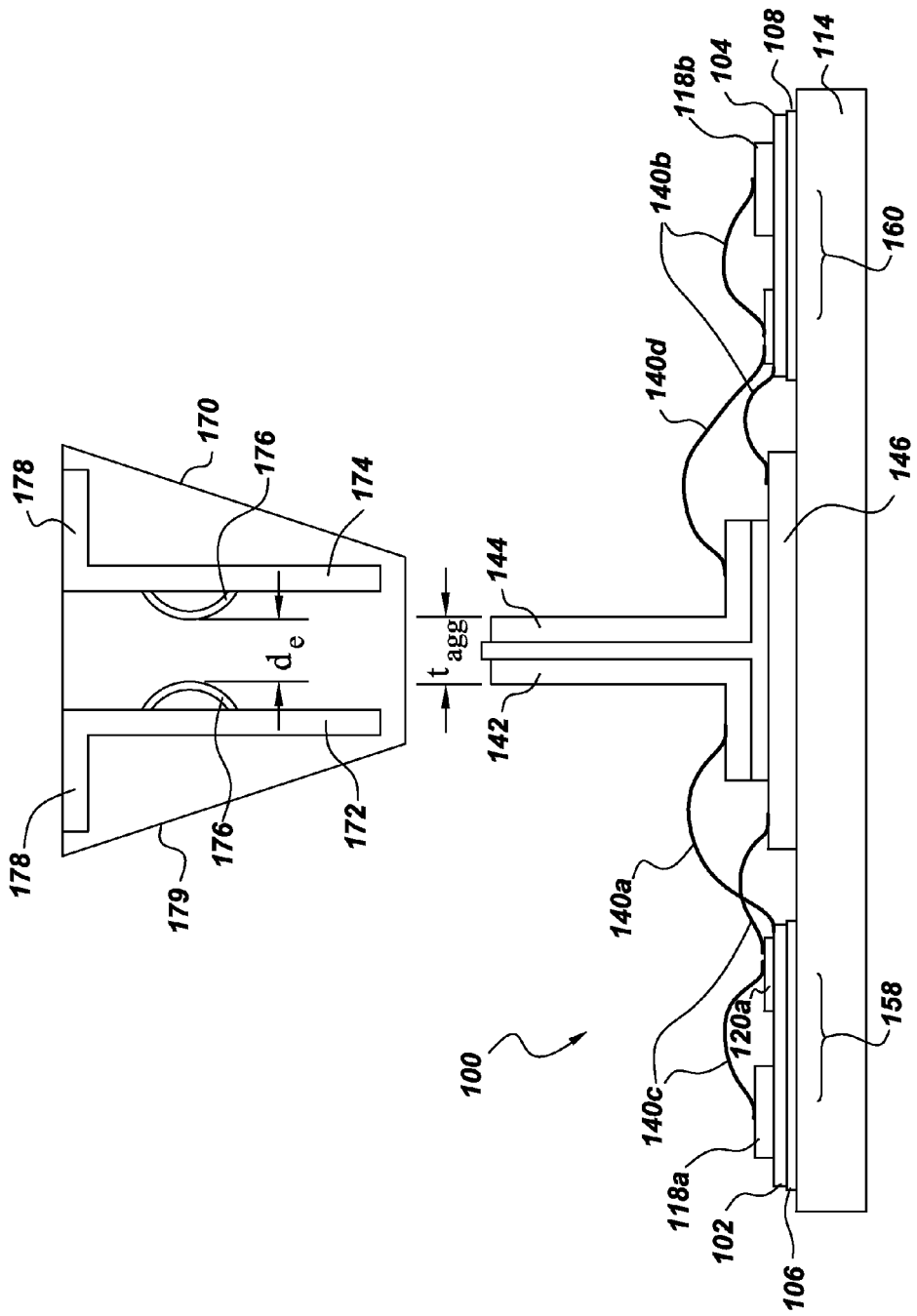
FIG. 9 is a side view of the module and connector of FIG. 8.

The magnitude of the area A will also be determined by the relative spacing of the wire bonds 140a-d. As such, referring to FIGS. 1, 2, and 7, the positive leads 140a that couple the positive terminal 142 and the first conductive substrate 102 may be configured such that each positive lead is proximal to a respective first output lead 140c substantially along a length of the respective positive lead. For example, the positive leads 140a may have an elongated shape (as would be expected for wire bonds) with a longitudinal length $l_1$, and a first output lead 140c can be respectively disposed near and substantially parallel to each of the positive leads, such that at each point along the length $l_1$, the distance $d_{p1}$ between each positive lead and the corresponding first output lead is small. Similarly, the second output leads 140d may have an elongated shape with a longitudinal length $l_2$, and a negative lead 140b can be respectively disposed near and substantially parallel to each of the second output leads, such that at each point along the length $l_2$, the distance $d_n2$ between each negative lead and the corresponding second output lead is small.

By reducing the area A and, therefore, the parasitic inductance of the circuit 156, some embodiments may act to reduce the amount of voltage overshoot that is produced by the circuit during switching events (during which the change in current with respect to time is expected to be high). Such a reduction in voltage overshoot may further lead to corresponding reductions in both the power losses and the voltage stresses in the involved devices.

Figure 10:
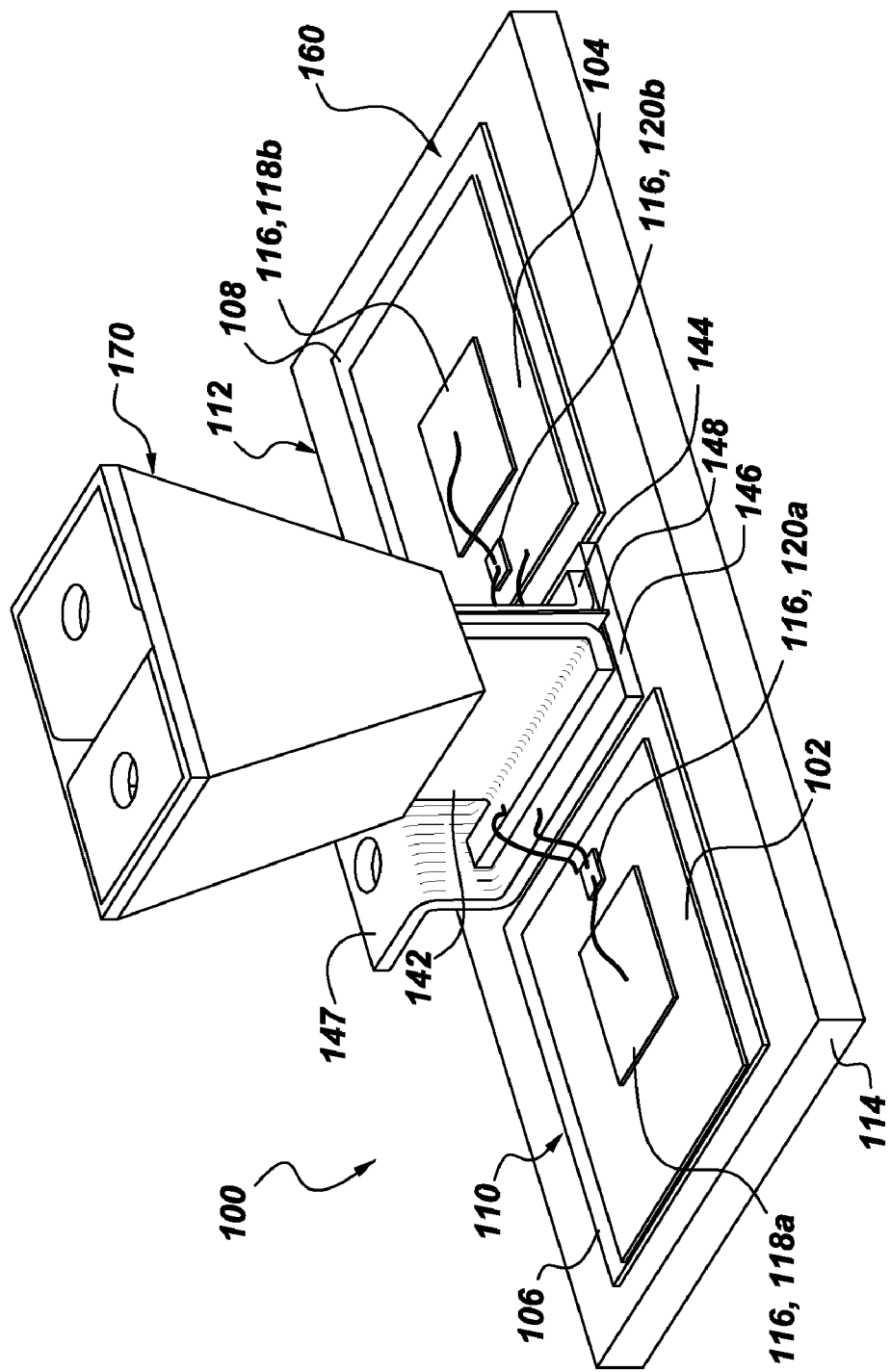
FIG. 10 is a perspective view of the coupled power module and connector of FIG. 9.
Figure 11:
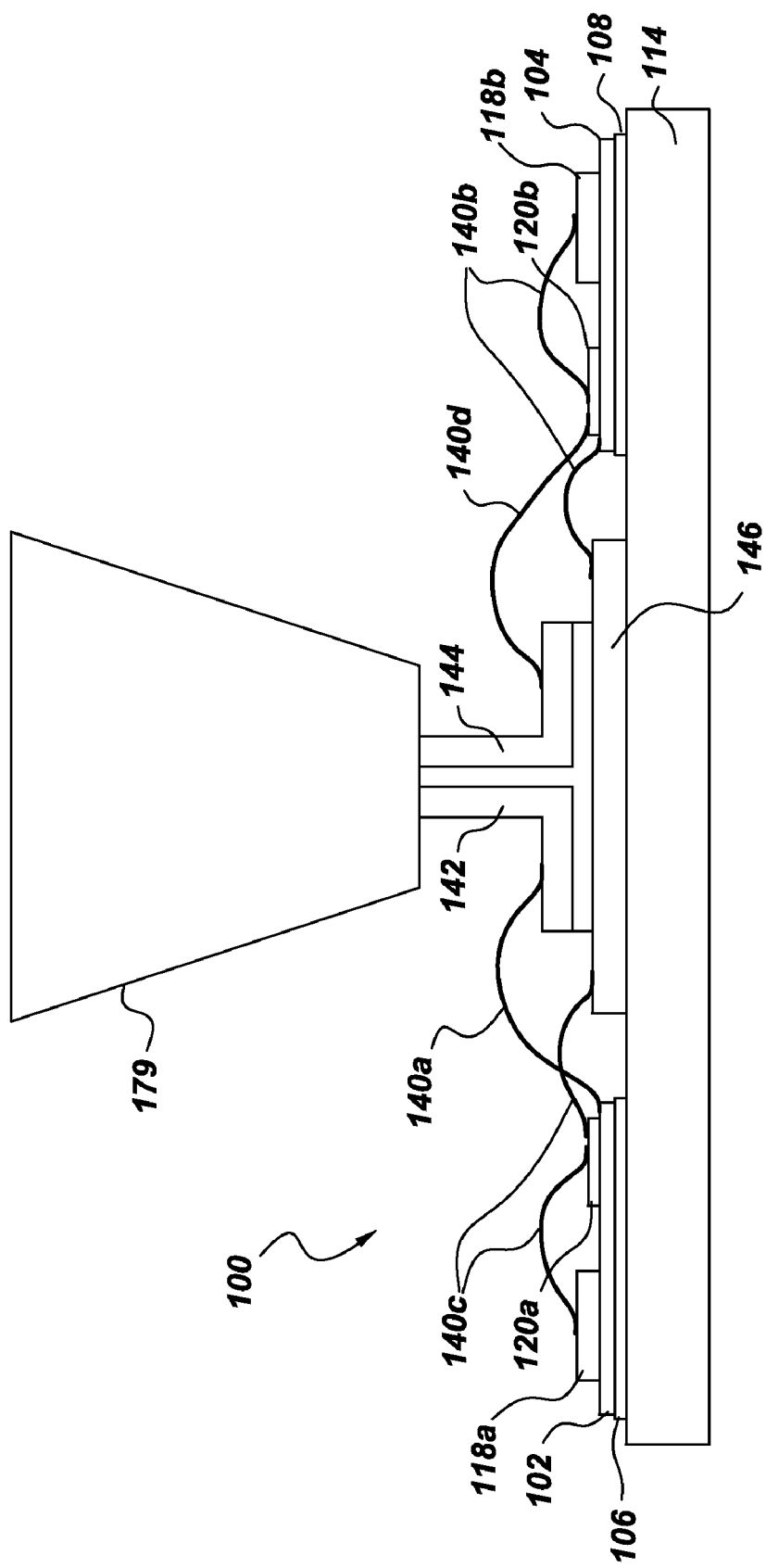
FIG. 11 is a side view of the coupled power module and connector of FIG. 9.
Figure 12:
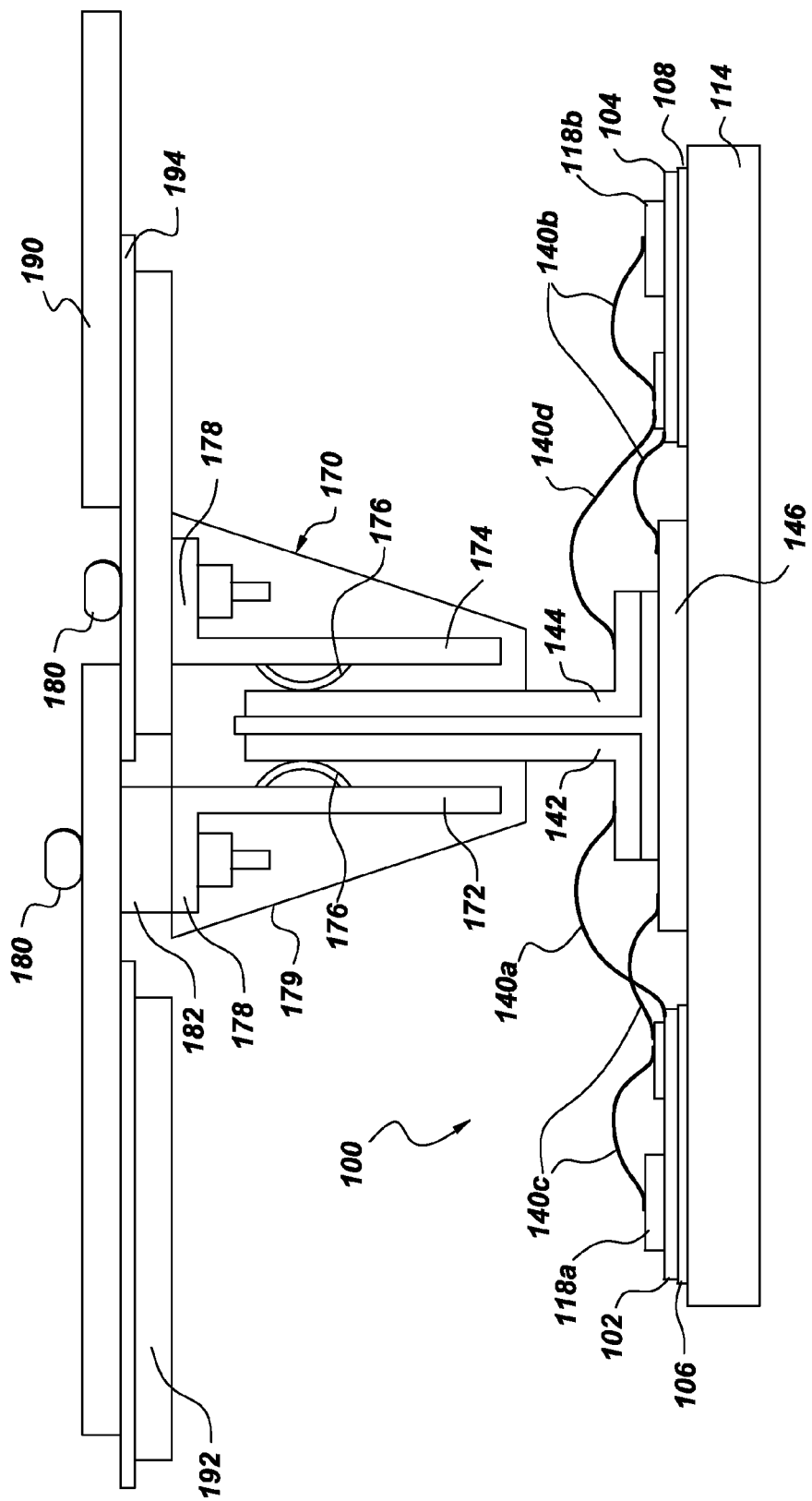
FIG. 12 is a cross sectional view of the coupled power module and connector of FIG. 9.

Referring to FIGS. 8-12, a connector 170 may also be included. The connector 170 may be configured to electrically couple each of the positive and negative terminals 142, 144 to respective positive and negative busbars 190, 192. The busbars 190, 192 may be separated by a thin layer of busbar insulation 194. The connector 170 may include opposing electrodes 172, 174. Resilient structures 176 may be used to provide physical and electrical contact between the electrodes 172, 174 and the terminals 142, 144. The connector 170 can then be fitted onto the terminals 142, 144 in order to establish the electrical connections between the electrodes 172, 174 and the terminals 142, 144 (e.g., as shown in FIGS. 10-12). The electrodes 172, 174 may include flanges 178 to facilitate coupling the electrodes to the respective busbars 190, 192, for example, with screws 180. The busbars 190, 192 may be offset from one another, and a metal shim 182 can be used to assure that both electrodes 172, 174 make contact with the appropriate busbar. The electrodes 172, 174 and resilient structures 176 may be enclosed within a housing 179. A separate connection can be made to the output terminal 146 by bolting to a flange 147 included therewith. In other embodiments, a connector (not shown) similar to the connector 170 can be used to make contact with the output terminal 146.

The resilient structures 176 can be configured to protrude only slightly from the surfaces of the opposing electrodes 172, 174 to which they respectively connect. In this way, the effective separation distance $d_e$ between the electrodes is substantially similar to an aggregate thickness $t_{agg}$ of the positive and negative terminals 142, 144 and the power insulation layer 148 therebetween. In other embodiments, the resilient structures 176 may be eliminated entirely, and the electrodes 172, 174 may be configured so as to make compressive contact with the terminals 142, 144.

Figure 13:
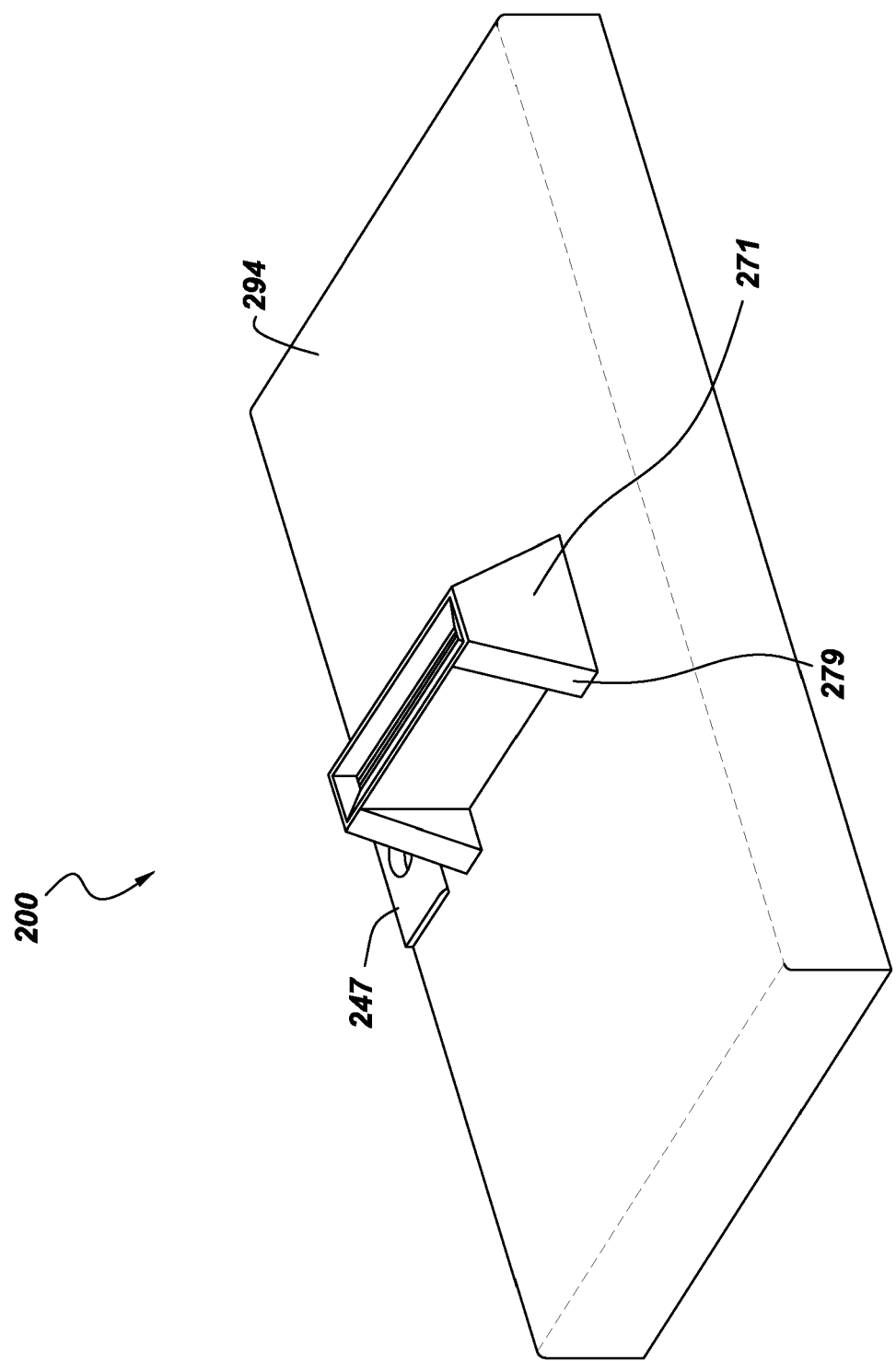
FIG. 13 is a perspective view of a power module configured in accordance with another example embodiment.
Figure 14:
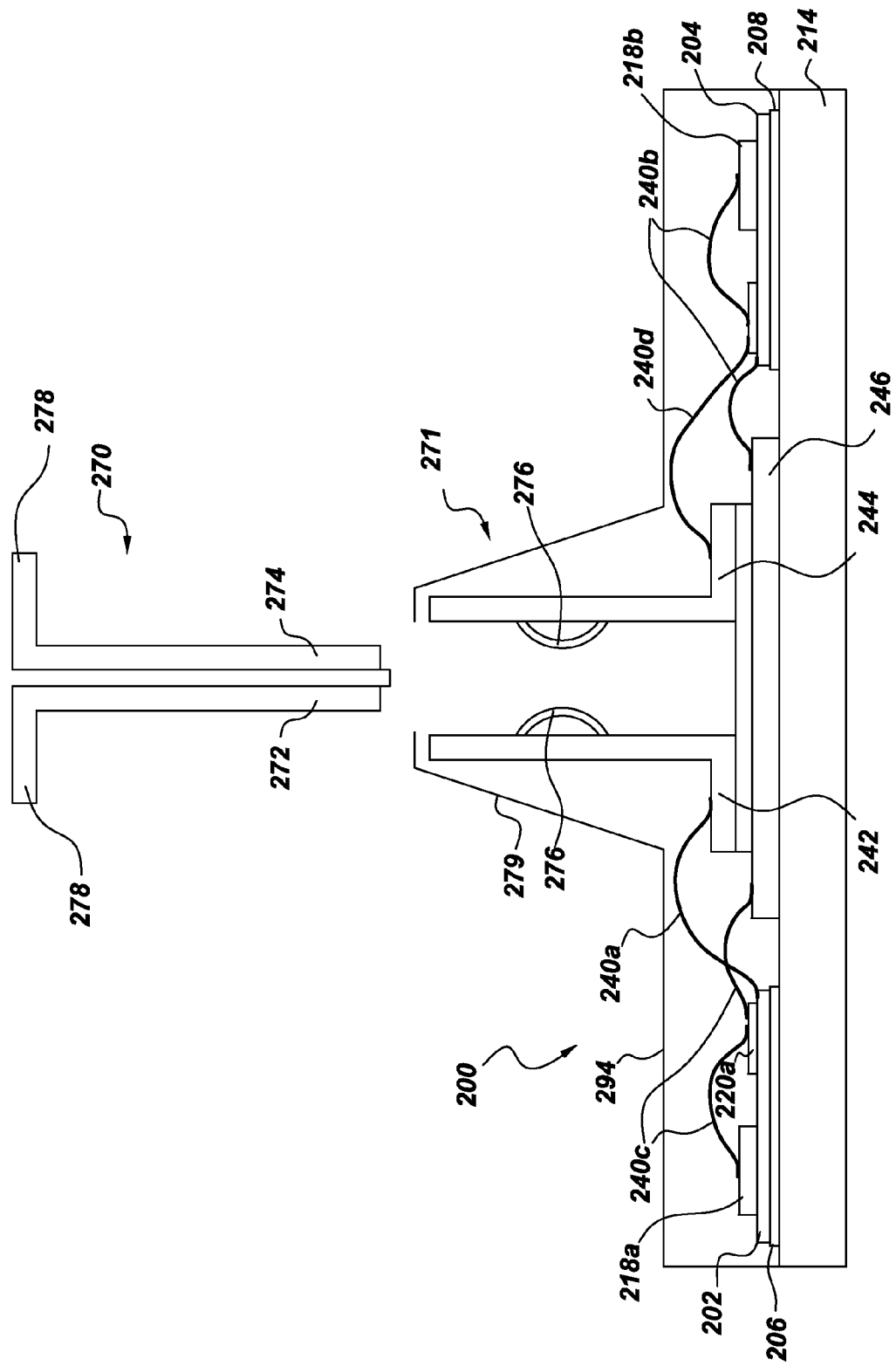
FIG. 14 is a cross sectional view of the power module of FIG. 13.

Connecting the module 100 to the busbars 190, 192 through the connector 170 may reduce the loop inductance of the overall circuit defined by the busbars and module relative to existing solutions. However, a variety of options for supplying power to the module 100 are available in addition to the above described connector 170. For example, referring to FIGS. 13 and 14, therein is shown a module 200 configured in accordance with another example embodiment. The module can include a socket structure 271 that includes positive and negative terminals 242, 244 of the module 200. For example, a cover plate 294 may be included with the module 200, and the socket structure 271 may include a housing 279 that is affixed to the cover plate and encloses the terminals 242, 244. Resilient structures 276 can be included, for example, on the terminals 242, 244. A connector 270 including opposing electrodes 272, 274 can then be selectively engaged with the socket structure 271 by sliding the connector into the socket structure, the resilient structures 276 ensuring compressive contact between the electrodes and terminals 242, 244. Again, a separate connection can be provided for the output terminal via a flange 247 connected thereto.

Figure 15:
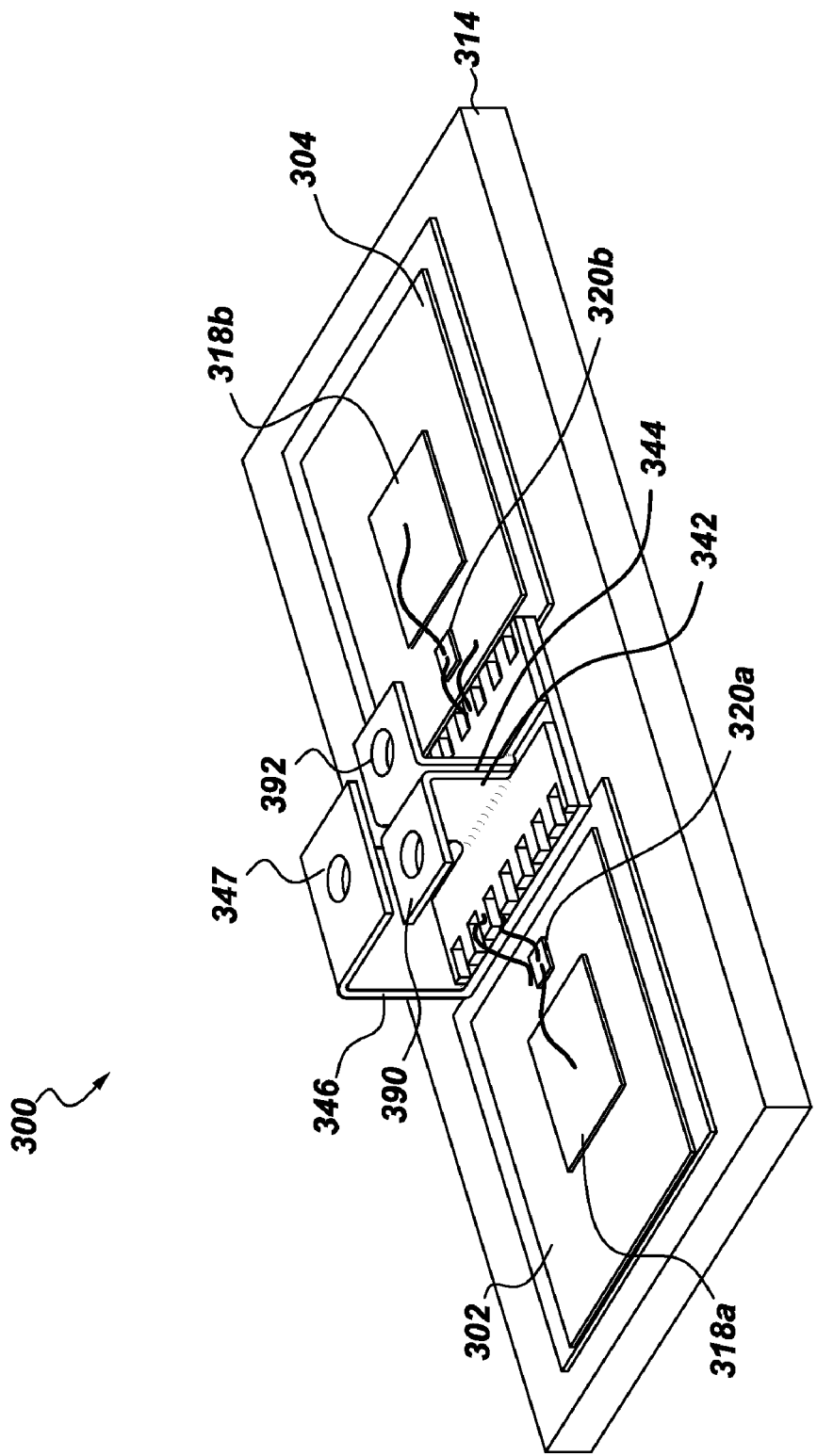
FIG. 15 is a perspective view of a power module configured in accordance with yet another example embodiment.

Referring to FIG. 15, therein is shown a module 300 configured in accordance with yet another example embodiment. The module 300 can include a positive terminal 342 and a negative terminal 344. An output terminal 346 may also be included, which output terminal may include a flange 347 to which the port of an electrical load may be physically bolted. The positive terminal 342, negative terminal 344, and output terminal 346 may all be electrically coupled to conductive substrates 302, 304 and to one or more IGBTs 318b and SBDs 320b, as described above in conjunction with module 100. The positive terminal 342 may include a flange 390, to which a an external positive busbar (not shown) may be physically bolted. Similarly, the negative terminal 344 may include a flange 392, for physical connection to an external negative busbar (not shown). A connection method as illustrated in FIG. 15 may introduce a greater amount of parasitic inductance than those exhibited, say, in FIGS. 8-14, but still may perform adequately in some applications.

While only certain features of the invention have been illustrated and described herein, many modifications and changes will occur to those skilled in the art. For example, while the above described embodiments have included IGBTs and SBDs, it is noted that the power semiconductor components (e.g., 116 in FIG. 1) may additionally, or alternatively, include one or more metal-oxide-semiconductor field effect transistors (MOSFETs) and/or a thyristors. For example, in some embodiments, MOSFETs may be substituted for the IGBTs. Alternatively, thyristors can be used as well, as where the associated power module is to be used for rectification applications. It is, therefore, to be understood that the appended claims are intended to cover all such modifications and changes as fall within the true spirit of the invention.

What is claimed:

1. A device comprising:
a first conductive substrate;
a second conductive substrate;
a first power semiconductor component that has a first thickness and is electrically coupled to said first conductive substrate;
a second power semiconductor component that has a second thickness and is electrically coupled to said second conductive substrate;
a positive terminal electrically coupled to said first conductive substrate;
a negative terminal electrically coupled to said second power semiconductor component via a conductor that extends generally along a connection direction; and
an output terminal electrically coupled to said first power semiconductor component and said second conductive substrate,
wherein said positive and negative terminals, said first and second power semiconductor components, and said first and second conductive substrates are incorporated into a common circuit loop and are configured such that a width of the circuit loop in at least one direction is defined by at least one of the first thickness or the second thickness, and
wherein said first and second power semiconductor components are respectively disposed on opposing sides of said positive terminal and of said negative terminal, and said first and second power semiconductor components are generally disposed so as to be aligned along the connection direction.

2. The device of claim 1, further comprising a respective diode connected in an anti-parallel arrangement across each of said first and second power semiconductor components.

3. The device of claim 1, wherein said positive and negative terminals, said first and second power semiconductor components, and said first and second conductive substrates are configured such that a first width of the circuit loop in at least one direction is about equal to the first thickness and a second width of the circuit loop in at least one direction is about equal to the second thickness, and the circuit loop everywhere has a width that is less than or about equal to the greater of the first thickness and the second thickness.

4. The device of claim 1, wherein said positive and negative terminals, said first and second power semiconductor components, and said first and second conductive substrates are configured such that a first width of the circuit loop in at least one direction is defined by the first thickness and a second width of the circuit loop in at least one direction is defined by the second thickness.

5. The device of claim 1, wherein said positive, negative, and output terminals are configured to support an instantaneous electrical current of at least about 10 A.

6. The device of claim 1, wherein said negative terminal substantially opposes said positive terminal.

7. The device of claim 1, wherein said positive and negative terminals abut opposing sides of a power insulation layer.

8. The device of claim 1, wherein said first and second power semiconductor components respectively include at least one component selected from the group consisting of an insulated gate bipolar transistor, a metal-oxide-semiconductor field effect transistor, a diode, and a thyristor.

9. The device of claim 1, wherein said first and second power semiconductor components respectively include a component formed of silicon carbide.

10. The device of claim 1, further comprising a substantially planar baseplate, and wherein said first and second conductive substrates are respectively disposed on said baseplate and said positive and negative terminals extend substantially perpendicularly away from said baseplate.

11. The device of claim 1, further comprising an output insulation layer, and wherein said output terminal and said positive terminal abut opposing sides of said output insulation layer, and said output terminal and said negative terminal abut opposing sides of said output insulation layer.

12. The device of claim 1, wherein said first and second power semiconductor components are respectively disposed on said first and second conductive substrates.

13. The device of claim 1, wherein each of said first and second power semiconductor components include opposing front and back surfaces, said back surface of said first power semiconductor component being electrically coupled to said first conductive substrate and said back surface of said second power semiconductor component being electrically coupled to said second conductive substrate.

14. The device of claim 1, wherein said positive and negative terminals are substantially planar.

15. The device of claim 1, further comprising a connector configured to electrically couple said positive and negative terminals to respective busbars.

16. The device of claim 15, wherein said positive and negative terminals abut opposing sides of a power insulation layer, and wherein said connector includes opposing electrodes configured to make respective electrical contact with said positive terminal and said negative terminal, and wherein a separation distance between said opposing electrodes is substantially similar to an aggregate thickness of said positive and negative terminals and said power insulation layer.

17. The device of claim 1, further including positive leads, negative leads, first output leads, and second output leads, and wherein said positive leads electrically couple said positive terminal and said first conductive substrate, said negative leads electrically couple said negative terminal and said second power semiconductor component, said first output leads electrically couple said output terminal and said first power semiconductor component, and said second output leads electrically couple said output terminal and said second conductive substrate.

18. The device of claim 17, wherein each of said positive leads is proximal to a respective first output lead substantially along a length of said respective positive lead, and each of said second output leads is proximal to a respective negative lead substantially along a length of said respective second output lead.

19. The device of claim 17, wherein each of said leads includes a wire bond.

* * * * *